United States Patent
Yoshitani et al.

(10) Patent No.: US 10,276,722 B2
(45) Date of Patent: Apr. 30, 2019

(54) THIN FILM TRANSISTOR

(71) Applicant: JOLED INC., Chiyoda-ku, Tokyo (JP)

(72) Inventors: Toshiaki Yoshitani, Tokyo (JP);
Shinichi Ushikura, Tokyo (JP)

(73) Assignee: JOLED INC., Tokyo (JP)

( * ) Notice: Subject to any disclaimer, the term of this patent is extended or adjusted under 35 U.S.C. 154(b) by 65 days.

(21) Appl. No.: 15/468,042

(22) Filed: Mar. 23, 2017

(65) Prior Publication Data

US 2017/0278974 A1     Sep. 28, 2017

(30) Foreign Application Priority Data

Mar. 24, 2016   (JP) ................. 2016-060913

(51) Int. Cl.
*H01L 29/786* (2006.01)
*H01L 29/49* (2006.01)
(Continued)

(52) U.S. Cl.
CPC ...... *H01L 29/7869* (2013.01); *H01L 27/1225* (2013.01); *H01L 27/1237* (2013.01);
(Continued)

(58) Field of Classification Search
CPC ..... H01L 29/7869; H01L 29/49; H01L 29/51; H01L 29/4908; H01L 29/786;
(Continued)

(56) References Cited

U.S. PATENT DOCUMENTS

2009/0045397 A1   2/2009 Iwasaki
2010/0276689 A1   11/2010 Iwasaki
(Continued)

FOREIGN PATENT DOCUMENTS

JP    11-186553 A    7/1999
JP    2000-323717 A  11/2000
(Continued)

OTHER PUBLICATIONS

"Successful Development of Oxide Semiconductor Based on New Element Composition with Stable Characteristics (New Element Composition Oxide Film Capable of Stable Production of High Definition Flat Panel)", National Institute for Materials Science, Sep. 20, 2013, Tsukuba Research Gakuen Press Conference, Ministry of Education Science Press Association, Science Press Conference.

*Primary Examiner* — Chuong A Luu
(74) *Attorney, Agent, or Firm* — Hauptman Ham, LLP

(57) ABSTRACT

A thin film transistor includes an oxide semiconductor layer including a channel region, and a source region and a drain region having a resistivity lower than that of the channel region; a gate insulating layer disposed on the channel region of the oxide semiconductor layer; a gate electrode disposed on the gate insulating layer; and an aluminum oxide layer covering the lateral surface of the gate insulating layer, and the source region and the drain region, wherein the gate insulating layer has a multi-layer structure including a first insulating layer and a second insulating layer, and the first insulating layer contains silicon oxide as a main component, and is disposed on and in contact with the channel region.

7 Claims, 14 Drawing Sheets

(51) Int. Cl.
*H01L 29/51* (2006.01)
*H01L 27/12* (2006.01)
*H01L 27/32* (2006.01)

(52) U.S. Cl.
CPC ...... *H01L 27/3262* (2013.01); *H01L 29/4908* (2013.01); *H01L 29/512* (2013.01); *H01L 29/517* (2013.01); *H01L 29/518* (2013.01); *H01L 29/49* (2013.01); *H01L 29/51* (2013.01)

(58) Field of Classification Search
CPC ... H01L 29/512; H01L 29/517; H01L 29/518; H01L 27/12; H01L 27/32; H01L 27/1225; H01L 27/1237; H01L 27/3262
USPC .......................................................... 257/43
See application file for complete search history.

(56) References Cited

U.S. PATENT DOCUMENTS

| | | | |
|---|---|---|---|
| 2010/0279462 A1 | 11/2010 | Iwasaki | |
| 2011/0193082 A1 | 8/2011 | Iwasaki | |
| 2013/0181214 A1* | 7/2013 | Yamazaki | H01L 29/7869 257/43 |
| 2014/0284594 A1 | 9/2014 | Nakano et al. | |
| 2016/0149042 A1* | 5/2016 | Sato | H01L 29/7869 257/43 |

FOREIGN PATENT DOCUMENTS

| | | |
|---|---|---|
| JP | 2006-190923 A | 7/2006 |
| JP | 2014-160830 A | 9/2014 |
| JP | 2014-183238 A | 9/2014 |

* cited by examiner

THIN FILM TRANSISTOR

CROSS REFERENCE TO RELATED APPLICATION

The present application is based on and claims priority of Japanese Patent Application No. 2016-060913 filed on Mar. 24, 2016. The entire disclosure of the above-identified application, including the specification, drawings and claims is incorporated herein by reference in its entirety.

FIELD

The present disclosure relates to thin film transistors.

BACKGROUND

Thin film semiconductor devices such as thin film transistors (TFTs) have been used in active matrix display devices for liquid crystal displays, or solid-state imaging devices for digital cameras. In displays, TFTs are used as switching elements which select pixels, driving transistors which drive pixels, or drivers disposed in regions out of display regions.

For example, organic EL display devices including organic electroluminescent (EL) elements including organic luminescent materials are current-driving display devices rather than voltage-driving liquid crystal displays. For this reason, an urgent development of TFTs having higher performance is required. Recently, TFTs including oxide semiconductors, such as InGaZnO semiconductors, have been actively developed as channel layers (see Patent Literature 1, for example).

CITATION LIST

Patent Literature

Japanese Unexamined Patent Application Publication No. 2014-160830

SUMMARY

Technical Problem

TFTs include silicon oxide films as gate insulating films, for example. The silicon oxide film is formed by plasma chemical vapor deposition (CVD) using silane gas ($SiH_4$) and nitrous oxide gas ($N_2O$) as introduced gases.

During formation of the silicon oxide film, a low proportion of silane gas may lead to damage of the channel region in the oxide semiconductor layer caused by a plasma treatment. The damaged channel region has reduced resistance, and thus reduces the threshold voltage of the resulting thin film transistor. In contrast, a large proportion of silane gas decreases the oxygen content in the gate insulating film. The decreased oxygen content reduces the insulation properties of the gate insulating film, and thus the breakdown voltage of the thin film transistor.

An object of the present disclosure is to provide a thin film transistor having high breakdown voltage and enabling prevention of a reduction in threshold voltage.

Solution to Problem

To achieve this object, a thin film transistor according to one aspect of the present disclosure includes an oxide semiconductor layer including a channel region, and a source region and a drain region having a resistivity lower than a resistivity of the channel region; a gate insulating layer disposed on the channel region of the oxide semiconductor layer; a gate electrode disposed on the gate insulating layer; and an aluminum oxide layer covering a lateral surface of the gate insulating layer, and the source region and the drain region, wherein the gate insulating layer has a multi-layer structure including a first insulating layer and a second insulating layer, and the first insulating layer contains silicon oxide as a main component, and is disposed on and in contact with the channel region.

Advantageous Effects

The present disclosure can provide a thin film transistor having high breakdown voltage and enabling prevention of a reduction in threshold voltage.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENT

The thin film transistors of embodiments according to the present disclosure will now be described in detail with reference to the drawings. The embodiments to be described below only show specific examples of the present disclosure. Accordingly, numeral values, shapes, materials, components, arrangements, positions, and connection forms of the components, steps, order of the steps, and the like shown in the embodiments below are only examples, and will not limit the present disclosure. Moreover, among the components of the embodiments below, the components not described in an independent claim representing the most superordinate concept of the present disclosure will be described as arbitrary components.

The drawings are each schematic views, and are not always illustrated in a strict manner. For example, these drawings are not always drawn to a scale. In these drawings, same reference numbers are given to substantially identical configurations, and the duplication of the description will be omitted or simplified.

Through the specification, the terms "upper" and "lower" are used as terms specified by relative positional relationships based on the order of lamination in laminate configuration, rather than terms indicating an upward direction (vertically above) and a downward direction (vertically below) in absolute space recognition. The terms "upper" and "lower" are used not only in the cases where two components are disposed at an interval and another component is present between the two components, but also in the cases where the two components adhere to each other, and are disposed in contact with each other.

Embodiment

1. Organic EL Display Device

Figure 1:
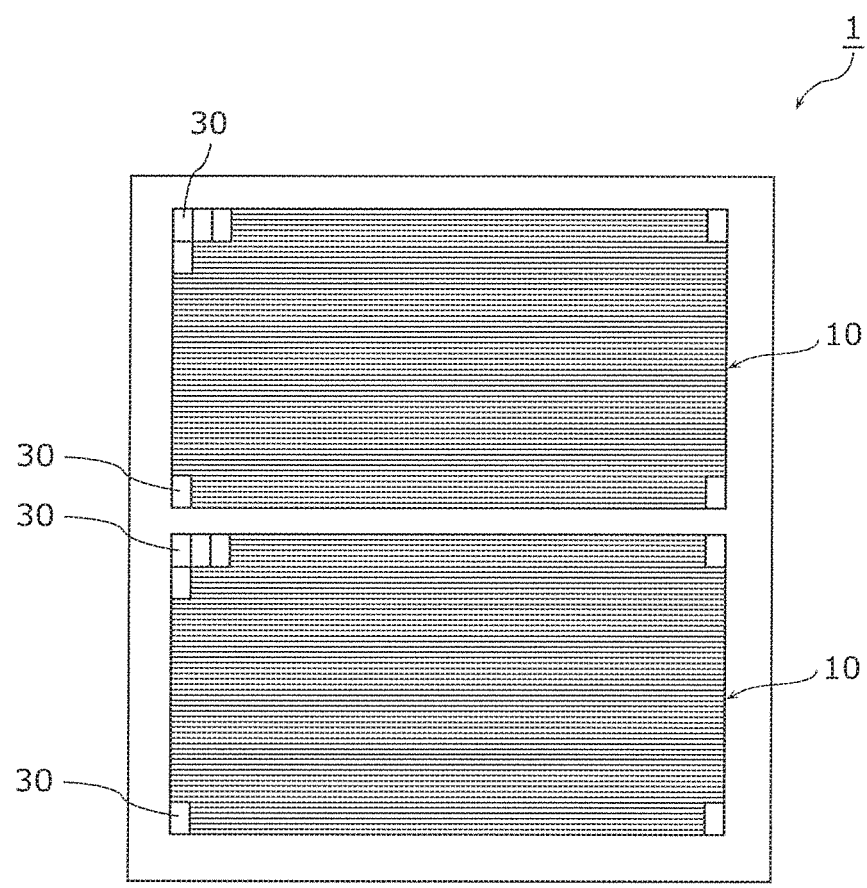
FIG. 1 is a drawing illustrating a thin film semiconductor array substrate according to an embodiment.
Figure 2:
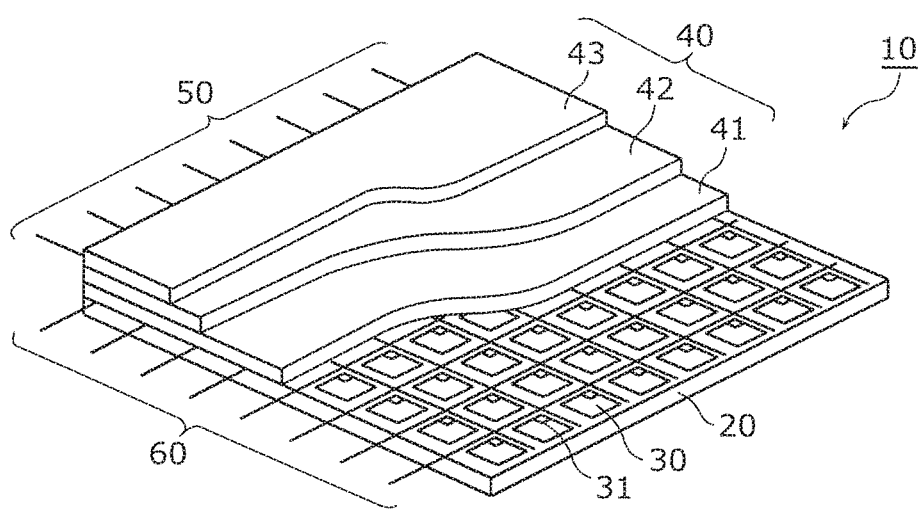
FIG. 2 is a partially cut-out perspective view illustrating an organic EL display device according to an embodiment.
Figure 3:
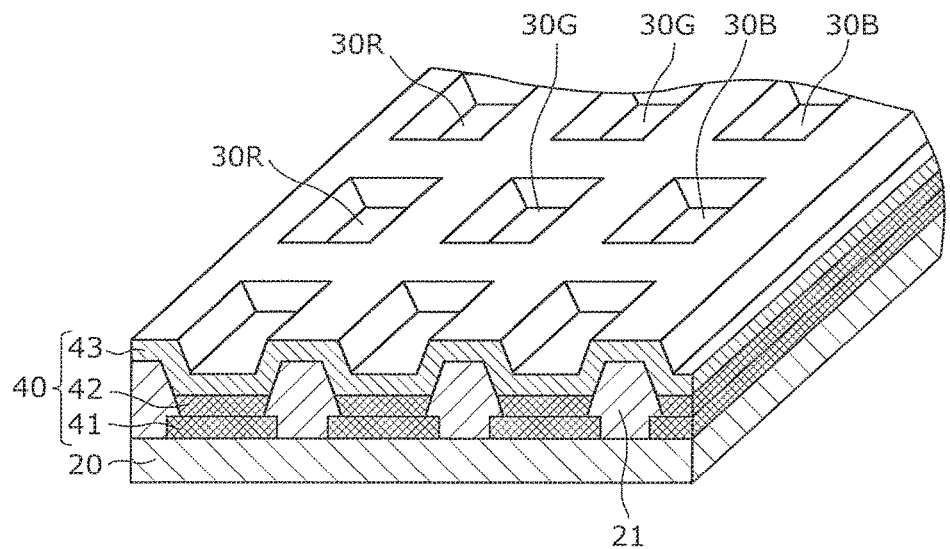
FIG. 3 is a perspective view illustrating an exemplary pixel bank in an organic EL display device according to an embodiment.
Figure 4:
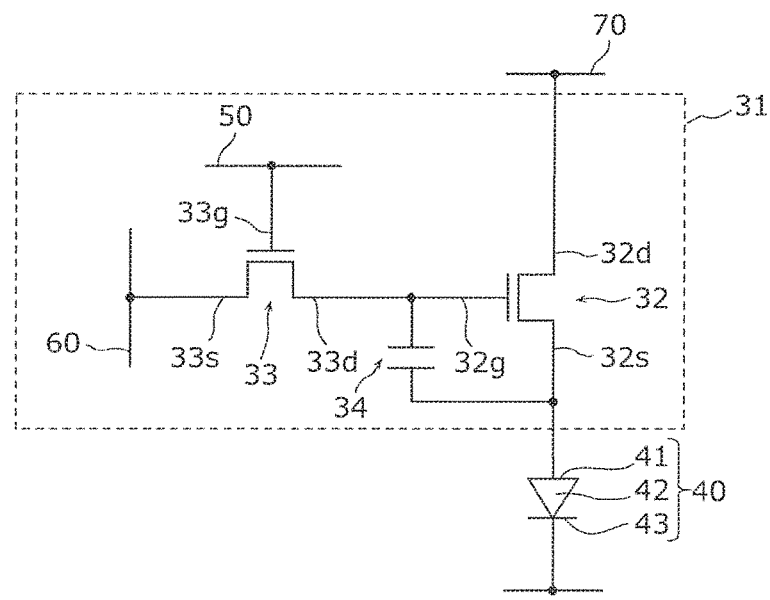
FIG. 4 is an electrical circuit diagram illustrating a configuration of a pixel circuit in an organic EL display device according to an embodiment.

First, an outline of an organic EL display device according to the present embodiment will be described with reference to FIGS. 1 to 4. FIG. 1 is a drawing illustrating the configuration of a thin film semiconductor array substrate 1 according to the present embodiment. FIG. 2 is a partially cut-out perspective view illustrating an organic EL display device 10 according to the present embodiment. FIG. 3 is a drawing illustrating an exemplary pixel bank of the organic EL display device 10 according to the present embodiment. FIG. 4 is a drawing illustrating the circuit configuration of a pixel circuit 31 in the organic EL display device 10 according to the present embodiment.

As illustrated in FIG. 1, the thin film semiconductor array substrate 1 includes a plurality (two in FIG. 1) of organic EL display devices 10. As illustrated in FIG. 2, the organic EL display device 10 has a laminate structure including a TFT substrate (TFT array substrate) 20 including a plurality of thin film transistors, and an organic EL element (luminescent unit) 40 including an anode 41 as a lower electrode, an EL layer 42 as a luminescent layer composed of an organic material, and a cathode 43 as a transparent upper electrode.

In the TFT substrate 20, a plurality of pixels 30 is disposed in the form of a matrix. Each pixel 30 includes pixel circuits 31.

The organic EL elements 40 are formed corresponding to the pixels 30. The pixel circuits 31 disposed in the pixels 30 control light emission of the organic EL elements 40, respectively. The organic EL elements 40 are formed on an interlayer insulating film (planarized layer) formed so as to cover a plurality of thin film transistors.

In the organic EL element 40, the EL layer 42 is disposed between the anode 41 and the cathode 43. Furthermore, a hole transport layer formed through lamination is disposed between the anode 41 and the EL layer 42 and an electron transport layer formed through lamination is disposed between the EL layer 42 and the cathode 43. Other organic functional layers (such as a hole injection layer and an electron injection layer) may be disposed between the anode 41 and the cathode 43.

Examples of usable materials for the anode 41 include conductive metals such as molybdenum, aluminum, gold, silver, and copper, and alloys thereof; organic conductive materials such as PEDOT:PSS; and zinc oxide or zinc-added indium oxide. The anode 41 is formed by a method such as vacuum evaporation, electron beam deposition, RF sputtering, or printing, for example.

The EL layer 42 is formed on the anode 41 and inside the opening of a bank (not illustrated) for each pixel 30 or line. The EL layer 42 may be formed using Alq3 (tris(8-hydroxyquinoline)aluminum), for example. For example, the hole injection layer may be formed using copper phthalocyanine, the hole transport layer may be formed using α-NPD (Bis[N-(1-Naphthyl)-N-Phenyl]benzidine), the electron transport layer may be formed using an oxazole derivative, and the electron injection layer may be formed using Alq3. These materials are only illustrative, and other materials may be used.

The cathode 43 may be formed using ITO, $SnO_2$, $In_2O_3$, ZnO, or a combination thereof.

The pixels 30 are driven through control of the pixel circuits 31. The TFT substrate 20 includes a plurality of gate wirings (scanning lines) 50 disposed along the row direction of the pixels 30, a plurality of source wirings (signal wirings) 60 disposed along the column direction of the pixels 30 intersecting the gate wirings 50, and a plurality of power supply wirings (not illustrated) disposed parallel to the source wirings 60. The pixels 30 are defined by the gate wirings 50 and the source wirings 60 orthogonally intersecting each other, for example.

The gate wirings 50 are connected to rows of gate electrodes of the thin film transistors included in the pixel circuits 31 and operating as switching elements. The source wirings 60 are connected to columns of source electrodes of the thin film transistors included in the pixel circuits 31 and operating as switching elements. The power supply wirings are connected to columns of drain electrodes of the thin film transistors included in the pixel circuits 31 and operating as driving elements.

As illustrated in FIG. 3, the pixels 30 of the organic EL display device 10 each include subpixels 30R, 30G, and 30B of three colors (red, green, and blue). These subpixels 30R, 30G, and 30B are formed such that a plurality of subpixels is aligned in the form of a matrix on a display. The subpixels 30R, 30G, and 30B are separated from each other by a bank 21.

The bank 21 is in the form of a lattice such that protrusions extending parallel to the gate wirings 50 intersect protrusions extending parallel to the source wirings 60. The portions surrounded by these protrusions (that is, openings of the bank 21) have one-to-one correspondence with the subpixels 30R, 30G, and 30B. Although the bank 21 in the present embodiment is a pixel bank, a line bank may be also used.

The anode 41 is formed on an interlayer insulating film (planarized layer) of the TFT substrate 20 and within the openings of the bank 21 for corresponding rows of subpixels 30R, 30G, and 30B. Similarly, the EL layer 42 is formed on the anodes 41 and within the openings of the bank 21 for corresponding rows of subpixels 30R, 30G, and 30B. The transparent cathode 43 is disposed in a continuous form on a plurality of banks 21 so as to cover all of the EL layers 42 (all of the subpixels 30R, 30G, and 30B).

The pixel circuits 31 are disposed corresponding to subpixels 30R, 30G, and 30B. The subpixels 30R, 30G, and 30B are electrically connected to their corresponding pixel circuits 31 through contact holes and relay electrodes. The subpixels 30R, 30G, and 30B have the same configuration except that the EL layer 42 emits light beams of different colors among the subpixels 30R, 30G, and 30B.

The circuit configuration of the pixel circuit 31 in the pixel 30 will now be described with reference to FIG. 4. FIG. 4 is an electrical circuit diagram illustrating an exemplary configuration of the pixel circuit 31 in the organic EL display device 10 according to the present embodiment.

As illustrated in FIG. 4, the pixel circuit 31 includes a thin film transistor 32 operating as a driving element, a thin film transistor 33 operating a switching element, and a capacitor 34 storing data to be displayed on its corresponding pixel 30. In the present embodiment, the thin film transistor 32 is a driving transistor for driving the organic EL element 40, and the thin film transistor 33 is a switching transistor for selecting the pixels 30.

The thin film transistor 32 includes a gate electrode 32g connected to a drain electrode 33d of the thin film transistor 33 and one end of a capacitor 34, a drain electrode 32d connected to a power supply wiring 70, a source electrode 32s connected to the other end of the capacitor 34 and the anode 41 of the organic EL element 40, and a semiconductor film (not illustrated). The thin film transistor 32 feeds the current corresponding to the data voltage held in the capacitor 34 from the power supply wiring 70 through the source electrode 32s to the anode 41 of the organic EL element 40. Thereby, the driving current flows from the anode 41 to the cathode 43 in the organic EL element 40, and the EL layer 42 emits light.

The thin film transistor 33 includes a gate electrode 33g connected to the gate wiring 50, a source electrode 33s connected to the source wiring 60, a drain electrode 33d connected to one end of the capacitor 34 and a gate electrode 32g of the thin film transistor 32, and a semiconductor film (not illustrated). When a predetermined voltage is applied to the gate wiring 50 and the source wiring 60 connected to the thin film transistor 33, the source and the drain are electrically conducted. Thereby, the voltage applied to the source wiring 60 is stored in the capacitor 34 as the data voltage.

The organic EL display device 10 having such a configuration employs an active matrix system to control display for each of the pixels 30 located at points of intersection of the gate wirings 50 and the source wirings 60. In the active matrix system, selective light emission of the organic EL elements 40 is performed by the corresponding thin film transistors 32 and 33 disposed in the pixels 30 (subpixels), displaying a desired image.

As the pixel circuit 31, FIG. 4 illustrates a pixel circuit having a so-called 2Tr1C configuration including two thin film transistors 32 and 33 and one capacitor 34, but the configuration of the pixel circuit is not limited to this. For example, the pixel circuit 31 may further include a transistor for correcting the threshold voltage of a transistor.

2. TFT

The thin film transistor disposed on the TFT substrate 20 according to the present embodiment will now be described with reference to FIG. 5.

A thin film transistor 100 according to the present embodiment is a top gate type TFT. The thin film transistor 100 is the thin film transistor 32 illustrated in FIG. 4, for example. In other words, the thin film transistor 100 can be used as a driving transistor. Specifically, in the case where the thin film transistor 100 is the thin film transistor 32, a gate electrode 150 corresponds to the gate electrode 32g, a source electrode 180s corresponds to the source electrode 32s, and a drain electrode 180d corresponds to the drain electrode 32d.

The thin film transistor 100 may be the thin film transistor 33 illustrated in FIG. 4, for example. In other words, the thin film transistor 100 may be used as a switching transistor.

Figure 5:
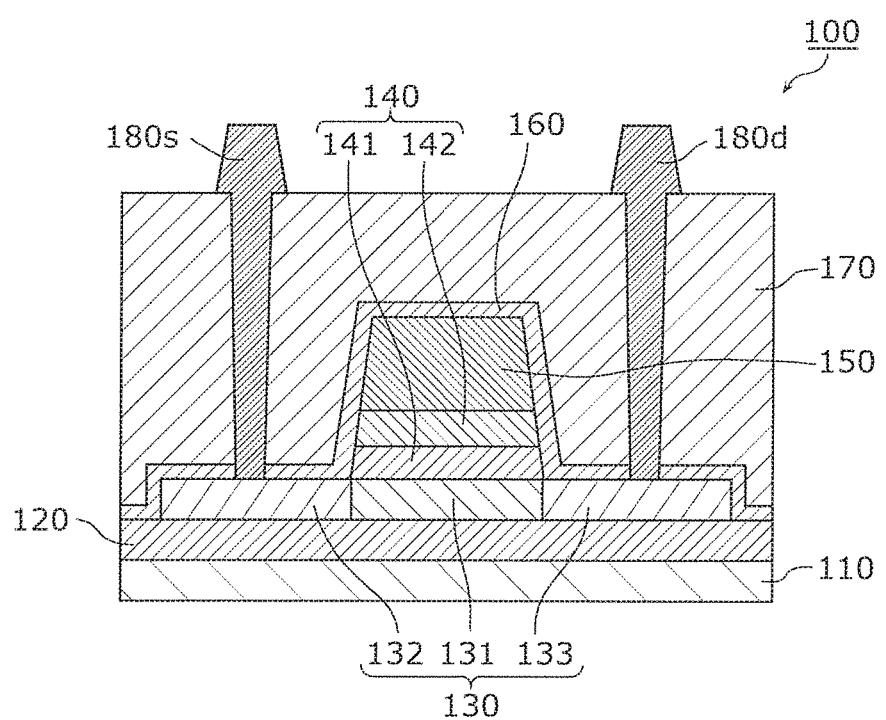
FIG. 5 is a sectional view illustrating a thin film transistor according to an embodiment.

FIG. 5 is a sectional view illustrating the thin film transistor 100 according to the present embodiment. As illustrated in FIG. 5, the thin film transistor 100 includes a substrate 110, an undercoat layer 120, an oxide semiconductor layer 130, a gate insulating layer 140, the gate electrode 150, an aluminum oxide layer 160, an interlayer insulating layer 170, the drain electrode 180d, and the source electrode 180s.

In the following description, the term "upper" indicates the side of the undercoat layer 120 with respect to the substrate 110, and specifically refers to the lamination direction of the layers. The term "lower" indicates the side opposite to the undercoat layer 120 with respect to the substrate 110, and specifically refers to the direction opposite to the lamination direction of the layers.

2-1. Substrate

The substrate 110 is, for example, a substrate composed of a material having electrical insulating properties. For example, the substrate 110 is composed of a glass material such as alkali-free glass, quartz glass, or high heat resistant glass, or a resin material such as polyethylene, polypropylene, or polyimide.

The substrate 110 may be a flexible substrate having flexibility in the form of a sheet or a film. The substrate 110 is, for example, a flexible resin substrate composed of a single layer or a lamination of a film material such as polyimide, poly(ethylene terephthalate), or poly(ethylene naphthalate).

In the case where the substrate 110 is a flexible substrate, a support substrate such as a glass substrate is disposed on the rear surface of the substrate 110 in the step of manufacturing the thin film transistor 100. For example, after the thin film transistor 100 and the organic EL element 40 are formed, the support substrate is peeled from the substrate 110, providing a TFT substrate 20 which can be used in flexible displays.

2-2. Undercoat Layer

The undercoat layer 120 is an exemplary inorganic layer disposed on the substrate 110. The undercoat layer 120 is disposed on the surface of the substrate 110 (the surface on which the oxide semiconductor layer 130 is disposed). The undercoat layer 120 included in the thin film transistor 100 can prevent invasion of impurities contained in the substrate 110 (such as sodium and phosphorus) or the moisture content in the air into the oxide semiconductor layer 130. The undercoat layer 120 can stabilize the quality of the oxide semiconductor layer 130, providing stable TFT properties.

The undercoat layer 120 is, for example, a single insulating layer including an oxide insulating layer or a nitride insulating layer or a laminate of insulating layers including an oxide insulating layer or a nitride insulating layer. As one example, the undercoat layer 120 may be a single layer film composed of silicon oxide ($SiO_x$), silicon nitride ($SiN_x$), silicon oxynitride ($SiON_x$), or aluminum oxide ($AlO_x$), or a lamination film thereof. In the present embodiment, the undercoat layer 120 is a lamination film formed through lamination of a plurality of insulating films. The undercoat layer 120 has a thickness of 100 nm to 2000 nm, for example.

2-3. Oxide Semiconductor Layer

The oxide semiconductor layer 130 is used as a channel layer. Specifically, as illustrated in FIG. 5, the oxide semiconductor layer 130 includes a channel region 131, a source region 132, and a drain region 133. The channel region 131 faces the gate electrode 150 with the gate insulating layer 140 being interposed therebetween. The source region 132 and the drain region 133 have lower resistivity than that of the channel region 131. The source region 132 and the drain region 133 are formed through generation of oxygen defect in predetermined regions of the formed oxide semiconductor.

The oxide semiconductor layer 130 is disposed on the upper region of the substrate 110, specifically on the undercoat layer 120 in a predetermined form. The oxide semiconductor layer 130 contains a metal oxide as a main component. Examples of the metal include indium (In), gallium (Ga), or zinc (Zn). The oxide semiconductor layer 130 may be composed of InGaZnO, InTiZnO, ZnO, InGaO, or InZaO, for example. In an example of an oxide semiconductor layer 130 composed of InGaZnO, the compositional ratio of the elements is $In_xGa_yZn_zO_{1.5x+1.5y+z}$ (where x, y, and z are integers). The oxide semiconductor layer 130 has a thickness of 10 nm to 300 nm, for example.

2-4. Gate Insulating Layer

The gate insulating layer 140 is disposed on the channel region 131 of the oxide semiconductor layer 130. In the present embodiment, the lateral surface of the gate insulating layer 140 is flush with the lateral surface of the channel region 131. In a top view, the outline of the gate insulating layer 140 approximately matches the outline of the channel region 131. In the present embodiment, the gate insulating layer 140 is disposed (but not limited to) only on the channel region 131 of the oxide semiconductor layer 130.

As illustrated in FIG. 5, the gate insulating layer 140 has a multi-layer structure including a first insulating layer 141 and a second insulating layer 142.

The first insulating layer 141 contains silicon oxide as a main component, and is disposed on and in contact with the channel region 131. The first insulating layer 141 has a thickness of 50 nm to 150 nm, for example. The first insulating layer 141 has a refractive index of 1.6 or less, for example, preferably 1.57 or less.

The second insulating layer 142 is an insulating layer containing oxygen in a smaller content than that of the first insulating layer 141. Specifically, the second insulating layer 142 substantially does not contain oxygen. For example, the second insulating layer 142 contains silicon nitride as a main component. The second insulating layer 142 has a thickness of 50 nm to 150 nm, for example.

2-5. Gate Electrode

The gate electrode 150 is disposed on the gate insulating layer 140. In the present embodiment, the lateral surface of the gate electrode 150 is flush with the lateral surface of the gate insulating layer 140. In a top view, the outline of the gate electrode 150 approximately matches the outline of the gate insulating layer 140.

The gate electrode 150 has a single layer structure or a laminate structure composed of a conductive material such as a metal or an alloy thereof. Examples of usable materials for the gate electrode 150 include aluminum (Al), molybdenum (Mo), tungsten (W), molybdenum tungsten (MoW), copper (Cu), titanium (Ti), and chromium (Cr). The gate electrode 150 has a thickness of 50 nm to 300 nm, for example.

2-6. Aluminum Oxide Layer

The aluminum oxide layer 160 is disposed on the oxide semiconductor layer 130 and in contact with the source region 132 and the drain region 133. In the present embodiment, the aluminum oxide layer 160 is disposed on portions of the oxide semiconductor layer 130 not covered with the gate insulating layer 140. Specifically, the aluminum oxide layer 160 is disposed on the source region 132 and the drain region 133.

More specifically, the aluminum oxide layer 160 covers the top surface and the lateral surface of the gate electrode 150, the lateral surface of the gate insulating layer 140, and the top surfaces of the source region 132 and the drain region 133. The aluminum oxide layer 160 is optionally disposed on the gate electrode 150.

The aluminum oxide layer 160 and the interlayer insulating layer 170 include a plurality of openings (contact holes) formed so as to penetrate through predetermined regions. Through the contact holes, the source region 132 is electrically and physically connected to the source electrode 180s, and the drain region 133 is electrically and physically connected to the drain electrode 180d.

The aluminum oxide layer 160 is a resistance reduction facilitating layer for facilitating a reduction in resistance of the oxide semiconductor layer 130. In the present embodiment, the aluminum oxide layer 160 facilitates a reduction in resistance of the source region 132 and the drain region 133 of the oxide semiconductor layer 130. Specifically, the aluminum oxide layer 160 generates oxygen defect by drawing oxygen from the source region 132 and the drain region 133. Thereby, the source region 132 and the drain region 133 have reduced resistance.

The source region 132 and the drain region 133 are electrically connected to the source electrode 180s and the drain electrode 180d, respectively. For this reason, the source region 132 and the drain region 133 should have low contact resistance. Since the aluminum oxide layer 160 reduces the resistance of the source region 132 and the drain region 133, the contact resistance thereof reduces, enhancing TFT properties.

The aluminum oxide layer 160 has a thickness sufficient to draw oxygen from the oxide semiconductor layer 130, for example, 10 nm or more, preferably 20 nm or more. The aluminum oxide layer 160 has a film density of 2.7 $g/cm^3$ or less.

2-7. Interlayer Insulating Layer

The interlayer insulating layer 170 is disposed so as to cover the aluminum oxide layer 160. Specifically, the interlayer insulating layer 170 is formed so as to cover the entire surface of the element region in which the thin film transistor 100 is formed.

The interlayer insulating layer 170 is formed using a material comprising an organic or inorganic substance as a main component.

For example, the interlayer insulating layer 170 may be a single-layer film composed of silicon oxide ($SiO_x$), silicon nitride ($SiN_x$), silicon oxynitride ($SiON_x$), aluminum oxide ($AlO_x$), or a lamination film thereof. At this time, the interlayer insulating layer 170 may be formed into a thick film using a material having low relative permittivity. Such an interlayer insulating layer can reduce the parasitic capacitance between the gate electrode 150 and the source electrode 180s or the drain electrode 180d.

2-8. Source Electrode and Drain Electrode

The source electrode 180s and the drain electrode 180d are formed into a predetermined form on the interlayer insulating layer 170. The source electrode 180s and the drain electrode 180d are electrically connected to the oxide semiconductor layer 130.

In the present embodiment, the source electrode 180s is electrically and physically connected to the source region 132 via the contact hole formed through the interlayer insulating layer 170 and the aluminum oxide layer 160. The drain electrode 180d is electrically and physically connected to the drain region 133 via the contact hole formed through the interlayer insulating layer 170 and the aluminum oxide layer 160.

The source electrode 180s and the drain electrode 180d each have a single-layer structure or a laminate structure including a conductive material or an alloy thereof. Examples of usable materials for the source electrode 180s and the drain electrode 180d include aluminum (Al), molybdenum (Mo), tungsten (W), molybdenum tungsten (MoW), copper (Cu), titanium (Ti), and chromium (Cr). The source electrode 180s and the drain electrode 180d have a thickness of 50 nm to 300 nm, for example.

3. Method of Manufacturing TFT

The method of manufacturing the thin film transistor 100 according to the present embodiment will now be described with reference to FIGS. 6A to 6C.

Figure 6A:
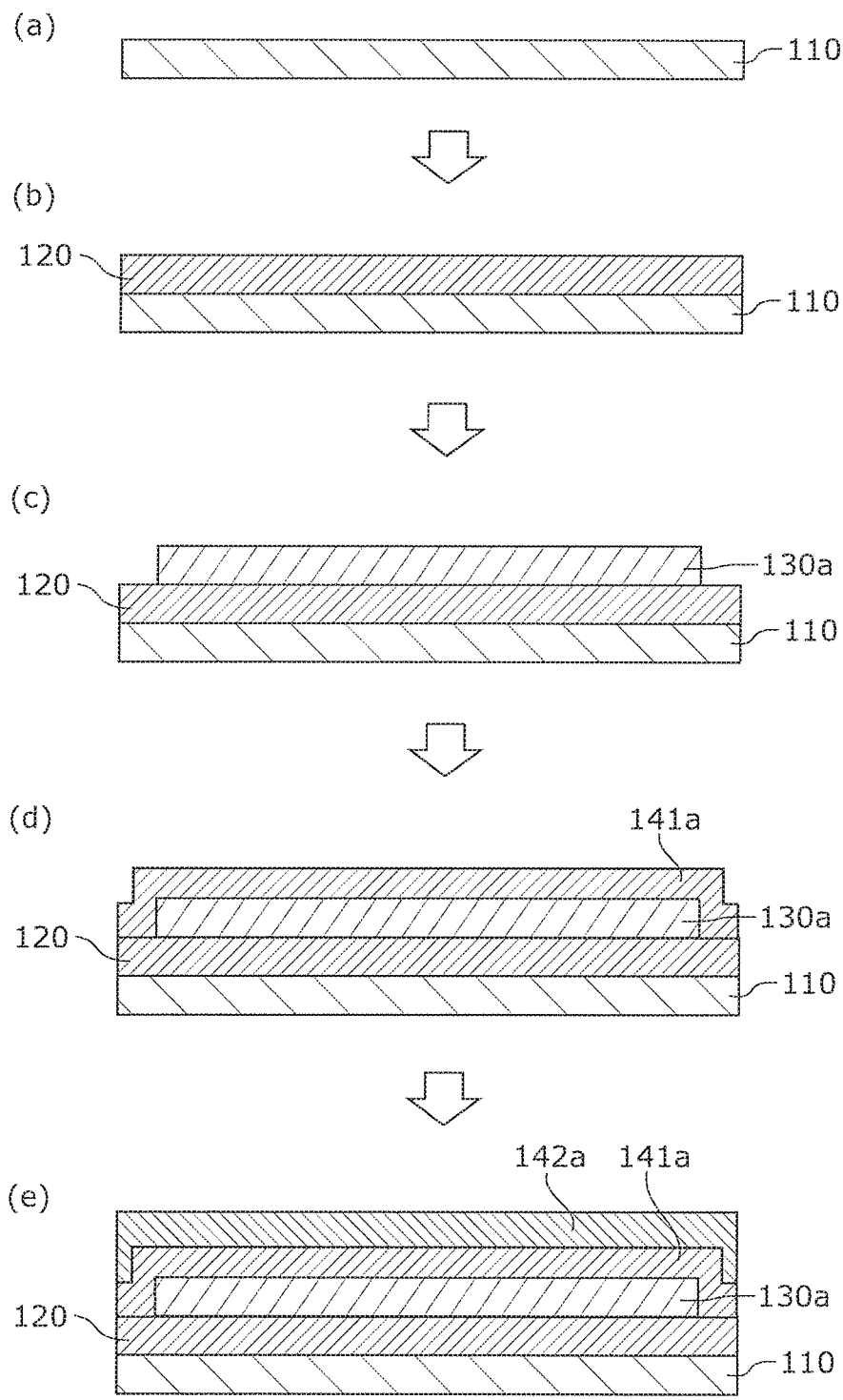
FIG. 6A is a sectional view illustrating steps from preparation of a substrate to formation of a second insulating film in a method of manufacturing a thin film transistor according to an embodiment.
Figure 6B:
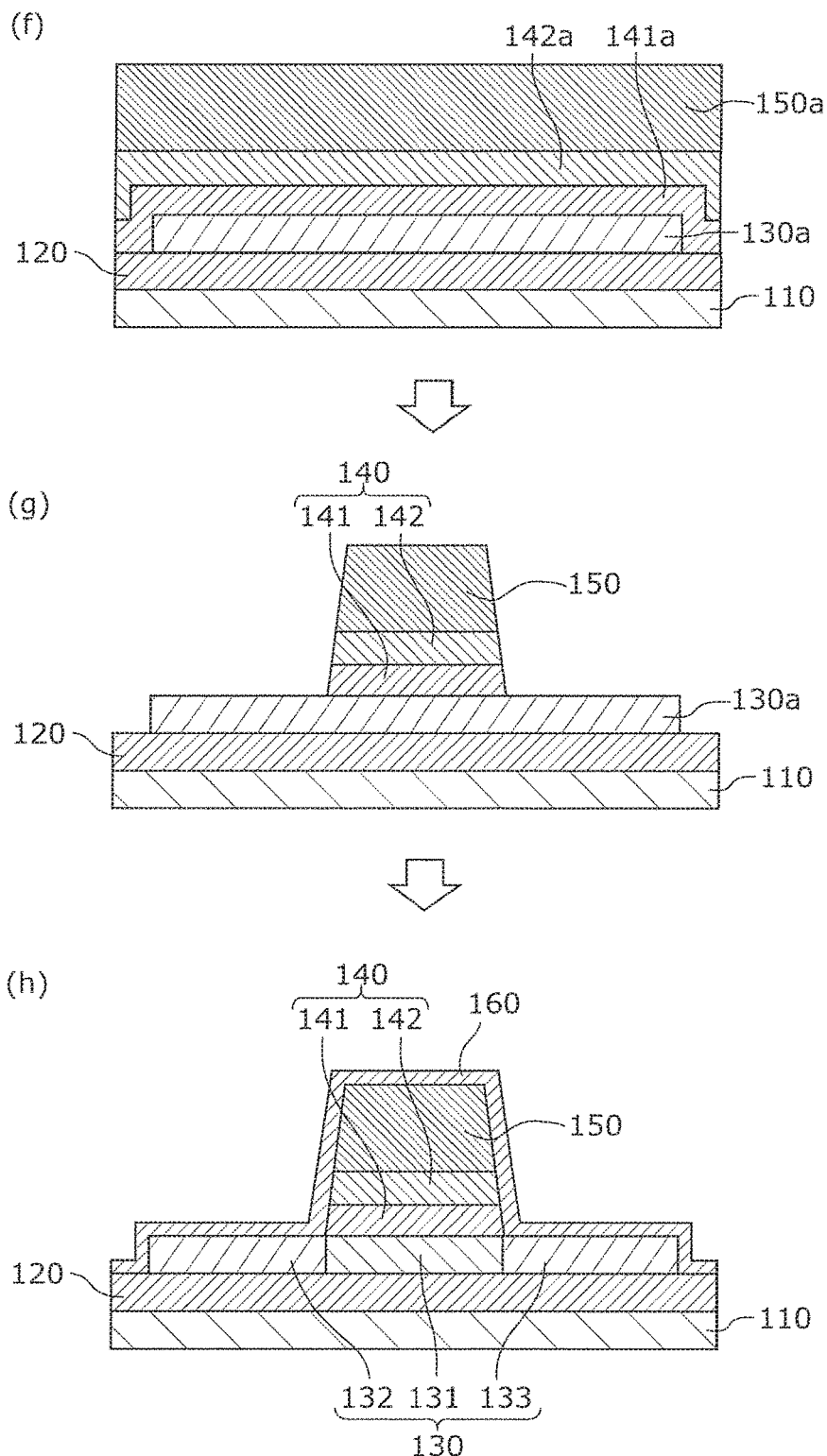
FIG. 6B is a sectional view illustrating steps from formation of a gate metal film to formation of an aluminum oxide layer in the method of manufacturing a thin film transistor according to an embodiment.
Figure 6C:
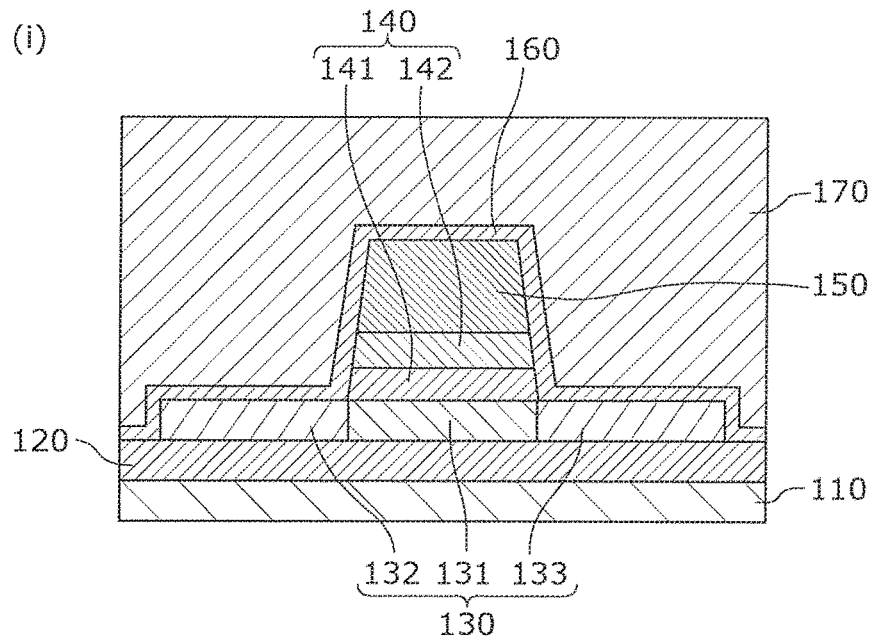
FIG. 6C is a sectional view illustrating steps from formation of an interlayer insulating layer to formation of contact holes in the method of manufacturing a thin film transistor according to an embodiment.
Figure 6C:
Figure 6C:
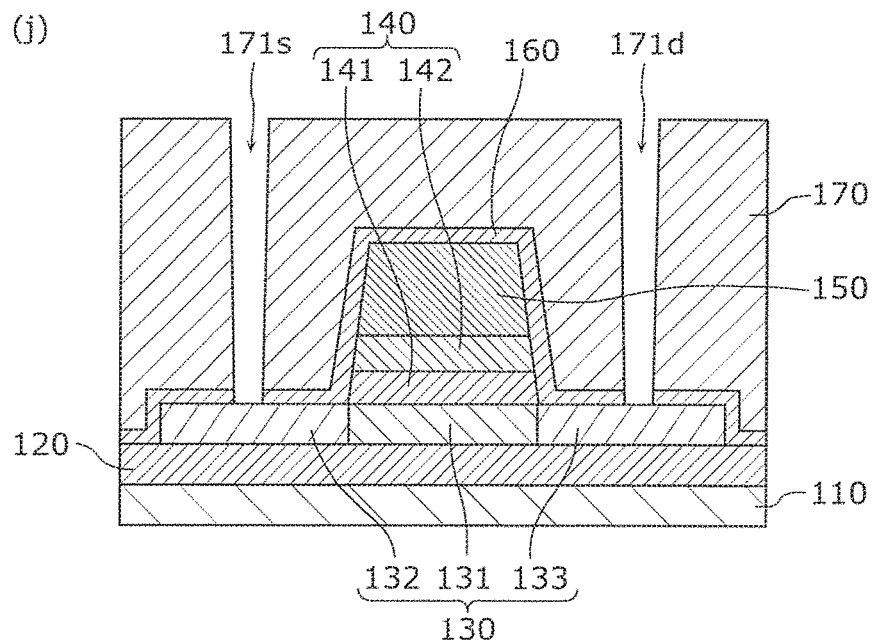

FIGS. 6A to 6C are sectional views illustrating the thin film transistor 100 according to the present embodiment. Specifically, FIG. 6A illustrates the steps of preparation of the substrate 110 to formation of the second insulating film 142a. FIG. 6B illustrates the steps of formation of a gate metal film 150a to formation of the aluminum oxide layer 160. FIG. 6C illustrates the steps of formation of the interlayer insulating layer 170 to formation of contact holes 171s and 171d.

As illustrated in (a) of FIG. 6A, a substrate 110 is prepared. The substrate 110 used is, for example, an alkali-free glass substrate. A resin substrate, a synthetic quartz substrate, or a silicon substrate with a thermally oxidized film may be also used.

In the next step, an undercoat layer 120 is formed on the substrate 110 as illustrated in (b) of FIG. 6A. The undercoat layer 120 is, for example, a laminate of films composed of a silicon nitride film and a silicon oxide film formed by a method such as plasma CVD, sputtering, or atom layer deposition (ALD).

As illustrated in (c) of FIG. 6A, an oxide semiconductor layer 130a is then formed above the substrate 110. Specifically, the oxide semiconductor layer 130a is formed on the undercoat layer 120 in a predetermined form. The oxide semiconductor layer 130a may be composed of a transparent amorphous semiconductor (TAOS) such as InGaZnO. For example, an InGaZnO film of 60 nm is formed as the oxide semiconductor layer 130a.

In this case, first, an oxide semiconductor film composed of InGaZnO is formed by sputtering, laser ablation, or plasma CVD. Specifically, a target material comprising In, Ga, and Zn (such as polycrystalline sinter comprising an $InGaO_3(ZnO)_4$ composition) is used. While an argon gas as an inert gas is introduced into a vacuum chamber and a gas containing oxygen ($O_2$) is introduced as a reactive gas, an electricity having a predetermined power density is applied to the target material.

Subsequently, the resulting oxide semiconductor film is patterned by photolithography and wet etching to form an oxide semiconductor layer 130a having a predetermined shape as illustrated in (c) of FIG. 6A. The oxide semiconductor layer 130a is disposed as an island having the predetermined shape. An InGaZnO film may be wet etched using a mixed chemical solution of phosphoric acid ($H_3PO_4$), nitric acid ($HNO_3$), acetic acid ($CH_3COOH$), and water ($H_2O$), for example.

As illustrated in (d) of FIG. 6A, a first insulating film 141a is then formed on the oxide semiconductor layer 130a. In the present embodiment, a silicon oxide film or the first insulating film 141a is formed so as to cover the entire oxide semiconductor layer 130a.

The silicon oxide film is formed by plasma CVD, for example. Specifically, silane gas ($SiH_4$) and nitrous oxide gas ($N_2O$) are introduced into a vacuum chamber to generate plasma. As a result, a silicon oxide film is formed. The proportion of the silane gas at this time is 3.6% or more, for example.

As illustrated in (e) of FIG. 6A, a second insulating film 142a is then formed on the first insulating film 141a. In the present embodiment, a silicon nitride film or the second insulating film 142a is formed so as to cover the entire first insulating film 141a.

The silicon nitride film is formed by plasma CVD, for example. Specifically, silane gas ($SiH_4$), ammonia gas ($NH_3$), and nitrogen gas ($N_2$) are introduced into a vacuum chamber to generate plasma. As a result, a silicon nitride film is formed.

In the present embodiment, since the first insulating film 141a and the second insulating film 142a are composed of a silicon oxide film and a silicon nitride film, respectively, these insulating films can be continuously formed. In other words, a silicon oxide film having a thickness needed for the first insulating film 141a is formed, and different gases are introduced. Thereby, the second insulating film 142a can be continuously formed without extracting the workpiece substrate from the chamber.

As illustrated in (f) of FIG. 6B, a gate metal film 150a is then formed on the second insulating film 142a. The gate metal film 150a is, for example, a laminate of Ti, Al, and Ti films formed on the second insulating film 142a by sputtering.

As illustrated in (g) of FIG. 6B, the gate metal film 150a, the first insulating film 141a, and the second insulating film 142a are processed into the gate electrode 150 and the gate insulating layer 140 having a multi-layer structure composed of the first insulating layer 141 and the second insulating layer 142. Thereby, a portion of the oxide semiconductor layer 130a (specifically, serving as the source region 132 and the drain region 133) is exposed.

Specifically, the gate metal film 150a is patterned by photolithography and etching to form a gate electrode 150 on the second insulating film 142a in a predetermined form. The gate metal film 150a, which is a laminate of Ti, Al, Ti films, can be etched by dry etching such as reactive ion etching (RIE) using gases such as sulfur hexafluoride ($SF_6$), oxygen ($O_2$), and boron trichloride ($BCl_3$).

Subsequently, the second insulating film 142a and the first insulating film 141a are patterned using the gate electrode 150 as a mask. This self-alignment process produces a gate insulating layer 140 having an approximately same shape as that of the gate electrode 150 seen in planar view. For example, the silicon nitride film or the second insulating film 142a and the silicon oxide film or the first insulating film 141a can be etched by dry etching using gases such as carbon tetrafluoride ($CF_4$) and oxygen gas ($O_2$). In the present embodiment, for example, the gate metal film 150a, the second insulating film 142a, and the first insulating film 141a can be continuously processed by dry etching in this order. The second insulating film 142a (silicon nitride film) may be processed by wet etching using a solution of phosphoric acid ($H_3PO_4$), for example. The first insulating film 141a (silicon oxide film) may be processed by wet etching using a solution of hydrofluoric acid (HF).

As illustrated in (h) of FIG. 6B, an aluminum oxide layer 160 is then formed on the oxide semiconductor layer 130a. The aluminum oxide layer 160 formed on the oxide semiconductor layer 130a reduces the resistance of a region of the oxide semiconductor layer 130a in contact with the aluminum oxide layer 160. Thus, the resistance of the source region 132 and that of the drain region 133 disposed on the oxide semiconductor layer 130 are reduced.

In the present embodiment, the aluminum oxide layer 160 is formed on the entire surface of the workpiece. Specifically, the aluminum oxide layer 160 is formed so as to cover the top surface and the lateral surface of the gate electrode 150, the lateral surface of the gate insulating layer 140 (first insulating layer 141 and second insulating layer 142), and the top surfaces of the source region 132 and the drain region 133. For example, an aluminum oxide layer 160 of 30 nm is formed during reactive sputtering.

The workpiece may be heat treated (annealed) before formation of the aluminum oxide layer 160. This heat treatment can restore the oxide semiconductor layer 130a damaged by the previous steps.

As illustrated in (i) of FIG. 6C, an interlayer insulating layer 170 is formed so as to cover the aluminum oxide layer 160. For example, a silicon oxide film of 200 nm is formed by plasma CVD as an interlayer insulating layer 170.

As illustrated in (j) of FIG. 6C, openings (contact holes 171s and 171d) are then formed through the interlayer insulating layer 170 and the aluminum oxide layer 160 such that part of the source region 132 and part of the drain region 133 expose. Specifically, part of the interlayer insulating layer 170 and part of the aluminum oxide layer 160 are removed by photolithography and etching to form the contact holes 171s and 171d above the source region 132 and the drain region 133.

For example, the interlayer insulating layer 170, which is a silicon oxide film, can be partially removed by dry etching using carbon tetrafluoride ($CF_4$) and oxygen gas ($O_2$). The aluminum oxide layer 160 can be partially removed by dry etching using a gas such as boron trichloride ($BCl_3$). The aluminum oxide layer 160 may be partially removed by wet etching using an aqueous solution of tetramethylammonium hydroxide (TMAH), for example.

Finally, a source electrode 180s electrically and physically connected to the source region 132 and a drain electrode 180d electrically and physically connected to the drain region 133 are formed in the contact holes 171s and 171d. Specifically, a metal film (source drain metal film) is formed on the interlayer insulating layer 170 by sputtering so as to fill the contact holes 171s and 171d. The metal film is patterned by photolithography and wet etching to form the source electrode 180s and the drain electrode 180d having predetermined shapes. For example, a metal film having a three-layer structure of MoW, Al, and MoW with a total thickness of 500 nm is formed as the source electrode 180s and the drain electrode 180d.

The thin film transistor 100 illustrated in FIG. 5 can be thereby manufactured.

4. Effects

The effects of the thin film transistor 100 according to the present embodiment will now be described with reference to FIGS. 7 to 11.

4-1. Comparative Examples

Figure 7:
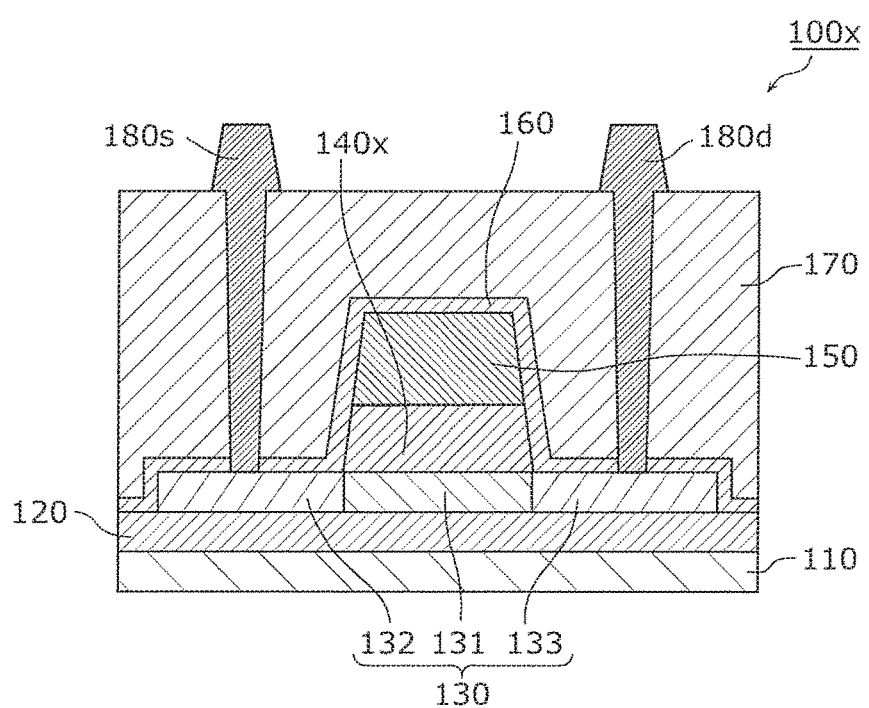
FIG. 7 is a sectional view illustrating a thin film transistor according to Comparative Example.

The results in the measurement of the properties of thin film transistors 100x according to Comparative Examples will be now described with reference to FIGS. 7 to 9. FIG. 7 is a sectional view illustrating a thin film transistor 100x according to Comparative Example. As illustrated in FIG. 7, the thin film transistors 100x according to Comparative Examples have the same configuration as that of the thin film transistor 100 according to an embodiment except that a gate insulating layer 140x has a single layer structure comprising silicon nitride or silicon oxide as a main component.

In the examination, two thin film transistors 100x (Comparative Examples 1 and 2) including gate insulating layers 140x composed of different materials were prepared, and the drain current properties and breakdown voltage properties of these thin film transistors were measured. Specifically, the gate insulating layers 140x according to Comparative Examples 1 and 2 are a silicon nitride film and a silicon oxide film having a thickness of 200 nm, respectively.

Figure 8:
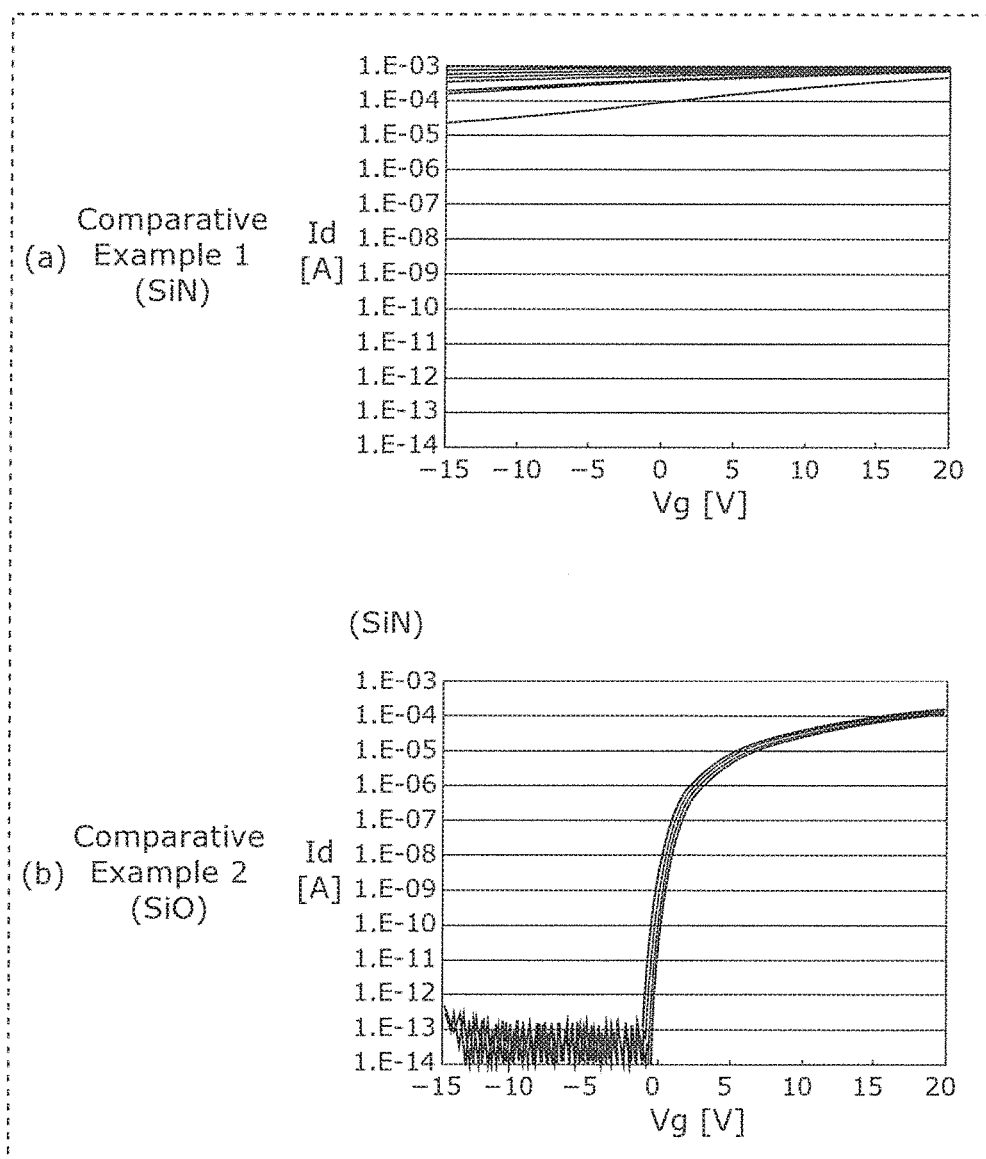
FIG. 8 is a drawing illustrating the drain current properties of the thin film transistor according to Comparative Example.

FIG. 8 is a drawing illustrating the drain current properties of the thin film transistors 100x according to Comparative Examples. (a) and (b) of FIG. 8 illustrate the drain current properties of the thin film transistors 100x according to Comparative Examples 1 and 2 (silicon nitride film and silicon oxide film), respectively. In (a) and (b) of FIG. 8, a plurality of lines illustrates the results of measurement at points (specifically 16 points) in a plane. The same is true of FIGS. 9 to 11 described later.

As illustrated in (b) of FIG. 8, in the case where the gate insulating layer 140x was a silicon oxide film, the thin film transistor 100x had a threshold voltage near 0 V, and had good drain current properties. In contrast, as illustrated in (a) of FIG. 8, in the case where the gate insulating layer 140x was a silicon nitride film, a linear region and a saturated region were not clearly recognized. The graph shows that a drain current flowed irrespective of the gate voltage, significantly reducing the threshold voltage. In the case where the gate insulating layer 140x was a silicon nitride film, it is believed that the threshold voltage was reduced because the resistance of the channel region 131 in the oxide semiconductor layer 130 was reduced due to hydrogen atoms contained in the gate insulating layer 140x.

These results show that the thin film transistor 100x had enhanced drain current properties in the case where a silicon oxide film was disposed as the gate insulating layer 140x.

Figure 9:
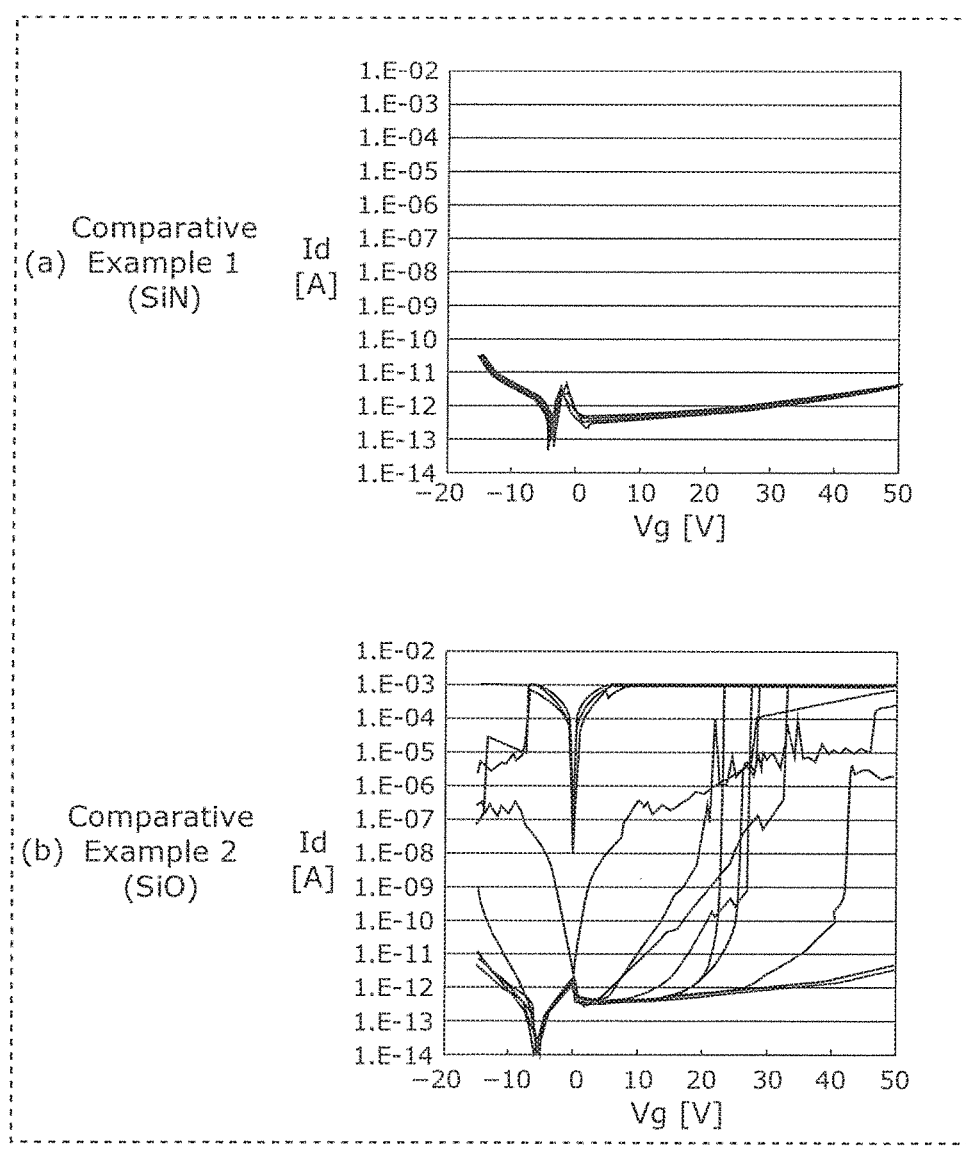
FIG. 9 is a drawing illustrating the breakdown voltage properties of the thin film transistor according to Comparative Example.

FIG. 9 is a drawing illustrating the breakdown voltage properties of the thin film transistors 100x according to Comparative Examples. (a) and (b) of FIG. 9 illustrate the breakdown voltage properties of the thin film transistors 100x according to Comparative Examples 1 and 2 (including silicon nitride film and silicon oxide film), respectively.

As illustrated in FIG. 7, the lateral surface of the gate insulating layer 140x is in contact with the aluminum oxide layer 160 in the thin film transistors 100x according to Comparative Examples. In such a configuration, in the case where the gate insulating layer 140x is a silicon oxide film, oxygen is drawn from the gate insulating layer 140x by the aluminum oxide layer 160 to decrease the oxygen content near the lateral surface of the gate insulating layer 140x. The decreased oxygen content leads to a reduction in insulation properties near the lateral surface of the silicon oxide film, facilitating a flow of leak current. For this reason, the breakdown voltage is reduced in the thin film transistor 100x including a silicon oxide film as the gate insulating layer 140x as illustrated in (b) of FIG. 9.

In contrast, in the case where the gate insulating layer 140x is a silicon nitride film, the insulation properties of the gate insulating layer 140x barely change because the gate insulating layer 140x does not contain oxygen to be drawn. Accordingly, as shown in (a) of FIG. 9, the thin film transistor 100x including a silicon nitride film as the gate insulating layer 140x had good breakdown voltage properties.

In conclusion, the breakdown voltage properties of the thin film transistor 100x are reduced in the case where the gate insulating layer 140x is a silicon oxide film.

In the thin film transistor 100x according to Comparative Examples, the drain current properties are traded off against the breakdown voltage properties, therefor not satisfying the prevention of a reduction in threshold voltage and the enhancement in breakdown voltage at the same time.

4-2. Examples

In contrast to Comparative Examples described above, the thin film transistor 100 according to the present embodiment has the gate insulating layer 140 having a multi-layer structure composed of the first insulating layer 141 and the second insulating layer 142 as illustrated in FIG. 5. The results of the properties of the thin film transistor 100 according to Example will now be described with reference to FIGS. 10 and 11.

The thin film transistor 100 according to Example included the first insulating layer 141 composed of a silicon oxide film and the second insulating layer 142 composed of a silicon nitride film. The proportion ($=SiH_4/(SiH_4+N_2O)$) of silane gas used in formation of a silicon oxide film was 3.6%.

In the examination, three thin film transistors 100 including a first insulating layer 141 and a second insulating layer 142 having a different thickness (Examples 1 to 3) were prepared to measure the drain current properties and breakdown voltage properties of the thin film transistors. In the thin film transistors 100 according to Example 1, the first insulating layer 141 had a thickness larger than that of the second insulating layer 142. Specifically, the first insulating layer 141 had a thickness of 150 nm, and the second insulating layer 142 had a thickness of 50 nm. In the thin film transistors 100 according to Example 2, the first insulating layer 141 had a thickness equal to that of the second insulating layer 142, specifically a thickness of 100 nm. In the thin film transistors 100 according to Example 3, the first insulating layer 141 had a thickness smaller than that of the second insulating layer 142. Specifically, the first insulating layer 141 had a thickness of 50 nm and the second insulating layer 142 had a thickness of 150 nm.

Figure 10:
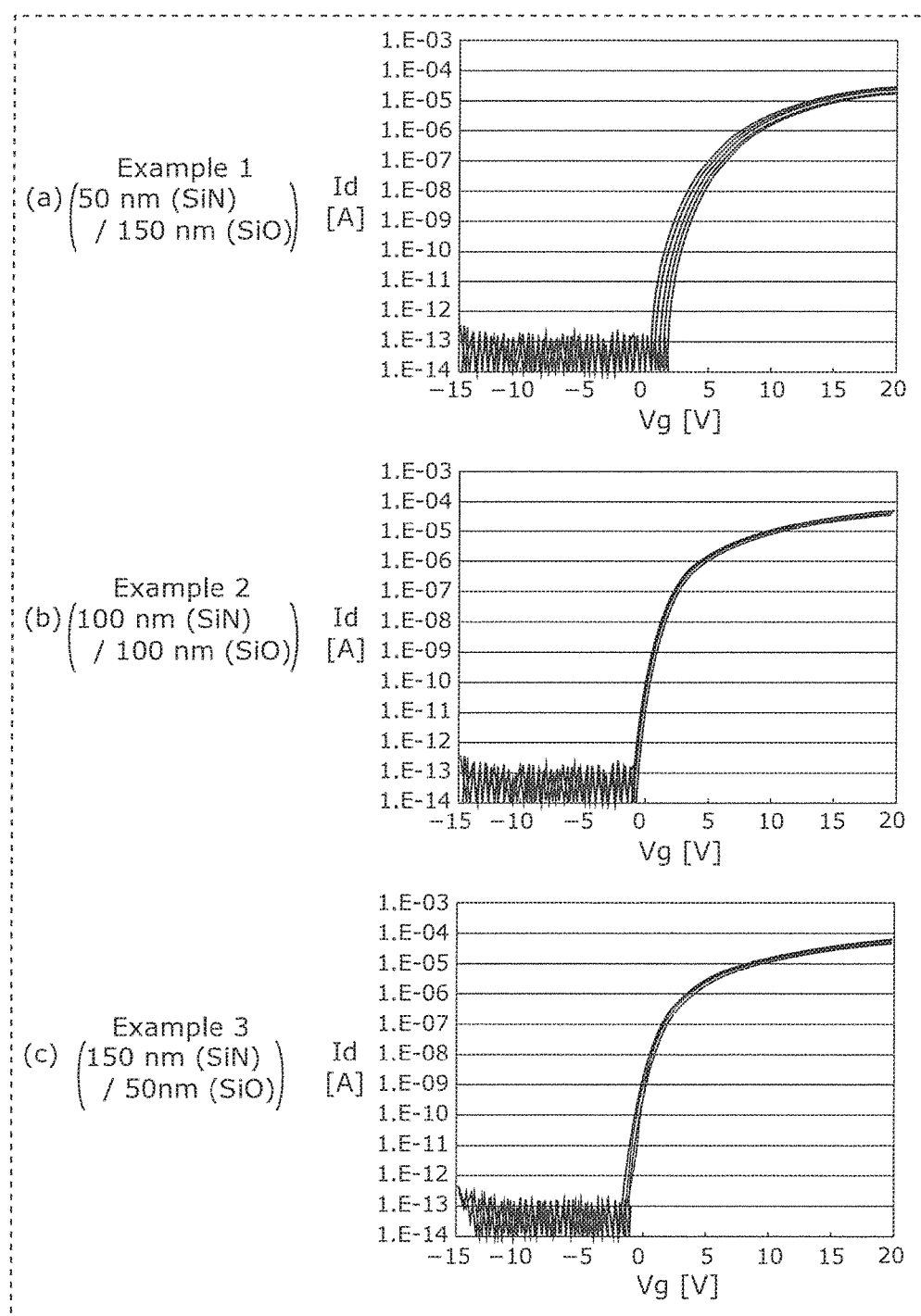
FIG. 10 is a drawing illustrating the drain current properties of the thin film transistor according to Example.

FIG. 10 is a drawing illustrating the drain current properties of the thin film transistor 100 according to Example. (a) to (c) of FIG. 10 illustrate the drain current properties of the thin film transistors 100 according to Examples 1 to 3, respectively.

As illustrated in FIG. 10, the linear region and the saturated region were recognized in Examples 1 to 3. The threshold voltages of the thin film transistors 100 according to Examples 1 to 3 are smaller in this order. For example, the threshold voltage of the thin film transistors 100 according to Example 1 is higher than 0 V, and the threshold voltage of the thin film transistors 100 according to Example 3 is lower than 0 V.

The results show that the threshold voltage of the thin film transistor was lower as the thickness of the first insulating layer 141 was smaller. Accordingly, it is found that the thickness of the first insulating layer 141 was increased to prevent a reduction in threshold voltage of the thin film transistor.

In the thin film transistor 100 according to the present embodiment, the first insulating layer 141 disposed immediately on the oxide semiconductor layer 130 is composed of a silicon oxide film. The silicon oxide film barely contains hydrogen compared to a silicon nitride film. For this reason, a reduction in resistance is prevented in the channel region 131 of the oxide semiconductor layer 130.

As described above, the silicon oxide film is formed by plasma CVD using silane gas and nitrous oxide gas. At this time, a low content (for example, 1.2% or less) of silane gas increases the amount of $N_2O$ plasma to which the channel region 131 is exposed during formation of the silicon oxide film. Such an increased amount of $N_2O$ plasma may cause oxygen deficit in the channel region 131, and thus reduce the resistance of the channel region 131.

For this reason, the first insulating layer 141 is formed using an introducing gas having a large content (for example, 3.6% or more) of silane gas. Thereby, the amount of the channel region 131 of the oxide semiconductor layer 130 to be exposed to $N_2O$ plasma can be reduced. Thus, a reduction in resistance of the channel region 131 can be prevented, preventing a reduction in threshold voltage of the thin film transistor.

Figure 11:
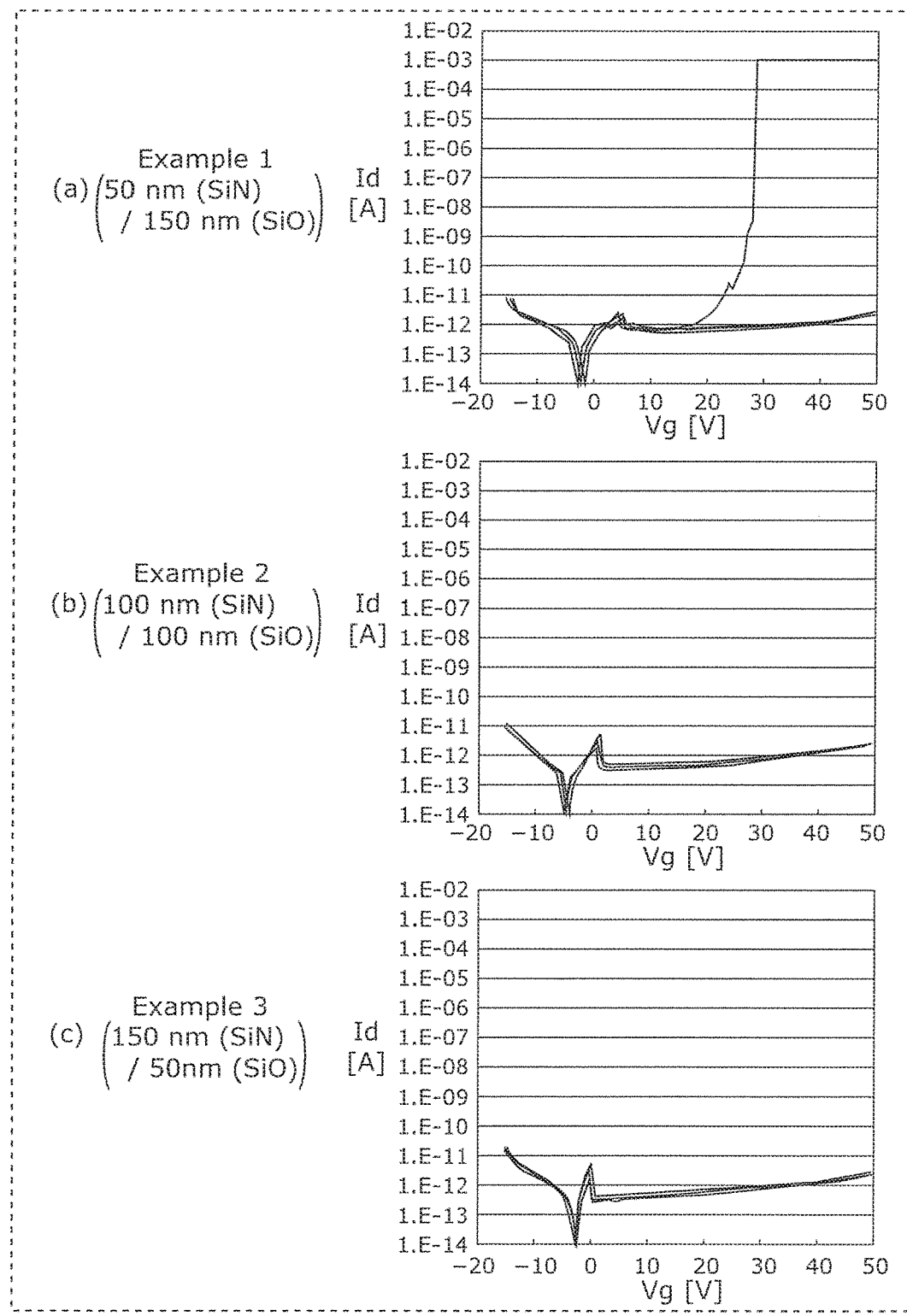
FIG. 11 is a drawing illustrating the breakdown voltage properties of the thin film transistor according to Example.

FIG. 11 is a drawing illustrating the breakdown voltage properties of the thin film transistors 100 according to Examples. (a) to (c) of FIG. 11 illustrate the breakdown voltage properties of the thin film transistors 100 according to Examples 1 to 3, respectively.

As illustrated in (a) of FIG. 11, the thin film transistor 100 according to Example 1 had only one point at which the gate current flowed under application of a gate voltage of about 30 V or more. The results also show that the gate current barely flowed at the remaining fifteen points of the thin film transistor 100 according to Example 1, as well as the sixteen points in the thin film transistors 100 according to Examples 2 and 3, when a gate voltage of 50 V was applied.

In the present embodiment, the second insulating layer 142, which is a silicon nitride film, is formed on the first insulating layer 141. The insulation properties of the second insulating layer 142 barely changes even if the lateral surface of the second insulating layer 142 is in contact with the aluminum oxide layer 160, because the second insulating layer 142 barely contains oxygen to be drawn. Thus, the insulation properties can be ensured near the lateral surface of the second insulating layer 142, increasing the breakdown voltage of the thin film transistor 100.

5. Summary

As described above, the thin film transistor 100 according to the present embodiment includes the oxide semiconductor layer 130 including the channel region 131, and the source region 132 and the drain region 133 having resistivity lower than that of the channel region 131; the gate insulating layer 140 disposed on the channel region 131 of the oxide semiconductor layer 130; the gate electrode 150 disposed on the gate insulating layer 140; and the aluminum oxide layer 160 covering the lateral surface of the gate insulating layer 140, and the source region 132 and the drain region 133, wherein the gate insulating layer 140 has a multi-layer structure including the first insulating layer 141 and the second insulating layer 142, and the first insulating layer 141 contains silicon oxide as a main component, and is disposed on and in contact with the channel region 131. For example, the second insulating layer 142 is an insulating layer having an oxygen content smaller than that of the first insulating layer 141. For example, the second insulating layer 142 contains silicon nitride as a main component.

Since the first insulating layer 141 is a silicon oxide film and has a small content of hydrogen atoms, a reduction in resistance of the channel region 131 can be prevented. Thus, a reduction in threshold voltage of the thin film transistor can be prevented.

In the thin film transistor 100 according to the present embodiment, the second insulating layer 142 is an insulating layer having an oxygen content smaller than that of the first insulating layer 141, for example, an insulating layer containing substantially no oxygen, such as a silicon nitride film. For this reason, substantially no oxygen is drawn from the lateral surface of the second insulating layer 142 by the aluminum oxide layer 160. Accordingly, the insulation properties of the second insulating layer 142 are kept even if the aluminum oxide layer 160 is in contact with the second insulating layer 142. Accordingly, the thin film transistor 100 can have increased breakdown voltage.

Moreover, the lateral surface of the channel region 131, the gate insulating layer 140, and the gate electrode 150 are approximately flush with each other, for example.

Such a configuration can form the gate insulating layer 140 and the gate electrode 150 through a self-alignment process, preventing a fluctuation in properties of the thin film transistor 100 and enhancing the reliability. This configuration also can eliminate steps such as alignment of the mask, achieving manufacturing the thin film transistor 100 at low cost.

Modification 1

Modification 1 of the embodiment will now be described.

Figure 12:
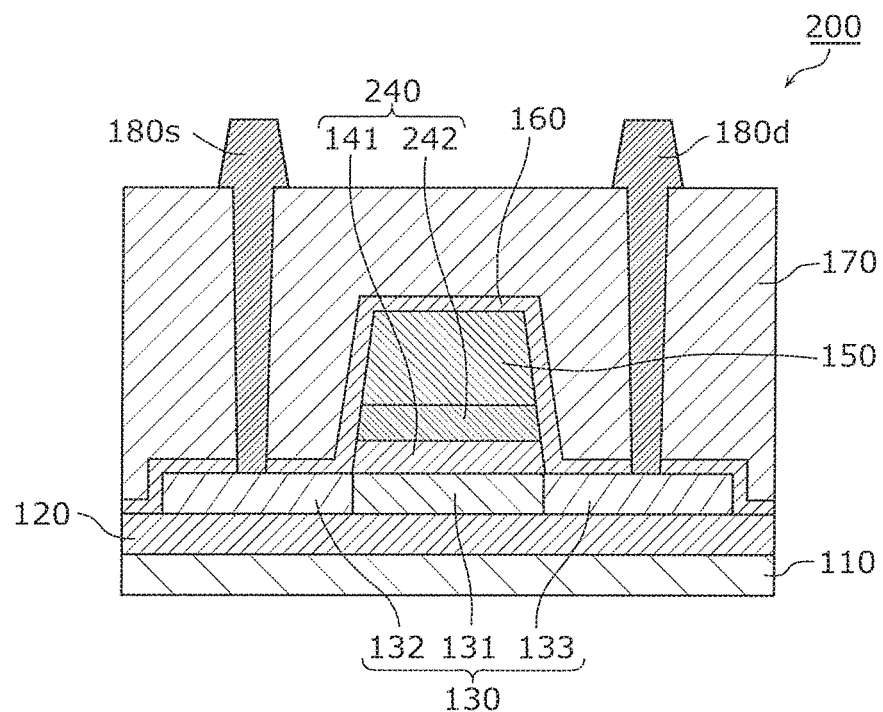
FIG. 12 is a sectional view illustrating a thin film transistor according to according to Modification 1.

FIG. 12 is a sectional view illustrating a thin film transistor 200 according to Modification 1. Unlike the thin film transistor 100 according to an embodiment illustrated in FIG. 5, the thin film transistor 200 includes a gate insulating layer 240 instead of the gate insulating layer 140. Differences will be mainly described, and the description of similarities will be omitted or simplified in the following description.

As illustrated in FIG. 12, the gate insulating layer 240 has a multi-layer structure composed of a first insulating layer 141 and a second insulating layer 242.

The second insulating layer 242 contains silicon oxide as a main component, the silicon oxide having an oxygen content larger than that of the first insulating layer 141. For example, the second insulating layer 242 is composed of an oxygen-rich silicon oxide film. The second insulating layer 242 has a thickness of 50 nm to 150 nm, for example. The second insulating layer 242 has a refractive index of 1.58 or more, for example.

The oxygen-rich silicon oxide film is formed by plasma CVD, for example. Specifically, silane gas ($SiH_4$) and nitrous oxide gas ($N_2O$) are introduced into a vacuum chamber to generate plasma. As a result, a silicon oxide film is formed. The content of silane gas at this time is 1.2% or less, for example. As the content of silane gas is smaller, the resulting silicon oxide film has a larger oxygen content. In Modification 1, the content of silane gas contained in the gas introduced during formation of the second insulating layer 242 is smaller than the content of silane gas contained in the gas introduced during formation of the first insulating layer 141.

In Modification 1, since the first insulating layer 141 and the second insulating layer 242 are composed of silicon oxide films, these insulating layers can be continuously formed. In other words, after a silicon oxide film having a thickness needed for the first insulating layer 141 is formed, the proportion of silane gas is changed. Thereby, these oxygen-rich silicon oxide films can be continuously formed without extracting the workpiece substrate from the chamber.

The resulting silicon oxide film is processed by dry etching or wet etching, for example. Dry etching can be performed by RIE using gases such as carbon tetrafluoride ($CF_4$) and oxygen gas ($O_2$), for example. Wet etching is performed using a solution of hydrofluoric acid (HF), for example.

In the thin film transistor 200 according to Modification 1, the first insulating layer 141 is a silicon oxide film having a small oxygen content, and formed by plasma CVD using an introducing gas having a large content of silane gas. Accordingly, a reduction in resistance of the channel region 131 exposed to $N_2O$ plasma during formation of the first insulating layer 141 can be prevented. Thus, a reduction in threshold voltage of the thin film transistor can be prevented.

The second insulating layer 242 contains silicon oxide having an oxygen content larger than that of the first insulating layer 141 as a main component, therefor providing a thin film transistor having higher breakdown voltage. In particular, in the case of Modification 1 where the lateral surface of the gate insulating layer 240 is in contact with the aluminum oxide layer 160, oxygen is drawn from the gate insulating layer 240 by the aluminum oxide layer 160, therefore facilitating a reduction in breakdown voltage.

In Modification 1, the second insulating layer 242 having a large content of oxygen prevents a reduction in resistance near the lateral surface of the second insulating layer 242. In other words, the insulation properties of the second insulating layer 242 can be ensured even if oxygen is drawn by the aluminum oxide layer 160. Accordingly, a reduction in breakdown voltage can be prevented in the thin film transistor 200 according to Modification 1.

Modification 2

Modification 2 of the embodiment will now be described.

Figure 13:
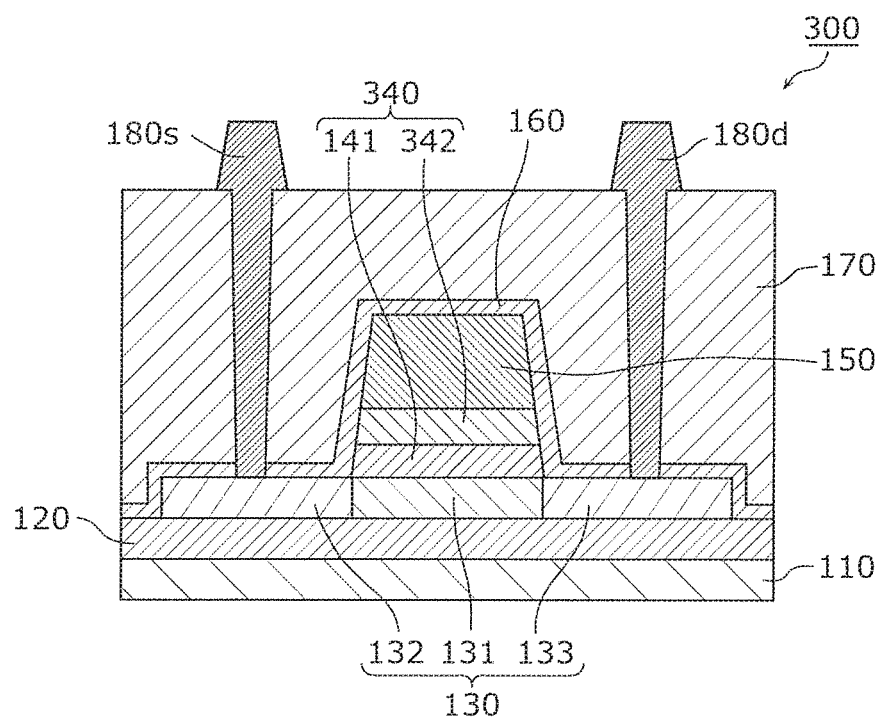
FIG. 13 is a sectional view illustrating a thin film transistor according to Modification 2.

FIG. 13 is a sectional view illustrating a thin film transistor 300 according to Modification 2. Unlike the thin film transistor 100 according to an embodiment illustrated in FIG. 5, the thin film transistor 300 includes a gate insulating layer 340 instead of the gate insulating layer 140. Differences will be mainly described, and the description of similarities will be omitted or simplified in the following description.

As illustrated in FIG. 13, the gate insulating layer 340 has a multi-layer structure composed of a first insulating layer 141 and a second insulating layer 342.

The second insulating layer 342 is an insulating layer having high binding energy to oxygen than that of the first insulating layer 141. Specifically, compared to the first insulating layer 141, oxygen in the second insulating layer 342 is barely drawn by the aluminum oxide layer 160 when the second insulating layer 342 is brought into contact with the aluminum oxide layer 160. For example, the second insulating layer 342 contains aluminum oxide, fluorine-added silicon oxide, carbon-added silicon oxide, or silicon oxynitride as a main component. The second insulating layer 342 has a thickness of 50 nm to 150 nm, for example.

The second insulating layer 342 is formed as an aluminum oxide film or a fluorine-added silicon oxide film formed by plasma CVD or sputtering. The resulting insulating film is processed by dry etching or wet etching, for example. The introducing gas to be used in dry etching or the chemical solution to be used in wet etching can be appropriately selected according to the type of the insulating film.

Similarly to the embodiment above, the channel region 131 of the oxide semiconductor layer 130 in the thin film transistor 300 according to Modification 2 is covered with the first insulating layer 141. Thereby, a reduction in resistance of the channel region 131 and thus a reduction in threshold voltage of the thin film transistor can be prevented as in the embodiment.

The thin film transistor 300 according to Modification 2 includes the second insulating layer 342 from which oxygen is barely drawn. For this reason, oxygen is barely drawn from the lateral surface of the second insulating layer 342 by the aluminum oxide layer 160, and the insulation properties of the second insulating layer 342 can be kept. Accordingly, the thin film transistor 300 can have increased breakdown voltage.

Modification 3

Modification 3 of the embodiment will now be described.

Figure 14:
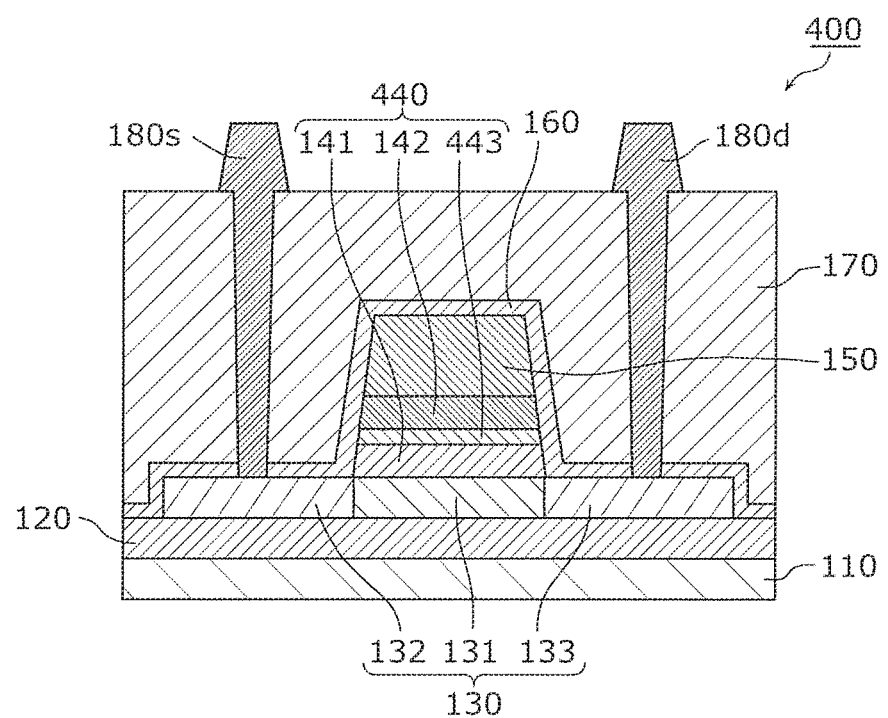
FIG. 14 is a sectional view illustrating a thin film transistor according to Modification 3.

FIG. 14 is a sectional view illustrating a thin film transistor 400 according to Modification 3. Unlike the thin film transistor 100 according to an embodiment illustrated in FIG. 5, the thin film transistor 400 includes a gate insulating layer 440 instead of the gate insulating layer 140. Differences will be mainly described, and the description of similarities will be omitted or simplified in the following description.

As illustrated in FIG. 14, the gate insulating layer 440 has a multi-layer structure including a first insulating layer 141, a third insulating layer 443, and a second insulating layer 142.

The third insulating layer 443 is disposed between the first insulating layer 141 and the second insulating layer 142 through lamination. The third insulating layer 443 is an insulating layer having higher binding energy to oxygen than that of the first insulating layer 141 as in Modification 2. For example, the third insulating layer 443 is an aluminum oxide film.

The second insulating layer 142 contains silicon nitride as a main component, and thus contains hydrogen. For this reason, the second insulating layer 142 may serve as a hydrogen feeding source to the channel region 131 of the oxide semiconductor layer 130 through the first insulating layer 141.

However, in the thin film transistor according to 400 Modification 3, the aluminum oxide film disposed as the third insulating layer 443 can prevent permeation of hydrogen. Accordingly, the third insulating layer 443 can prevent invasion of hydrogen from the second insulating layer 142 through the first insulating layer 141 to the channel region 131.

In Modification 3, the third insulating layer 443 may contain silicon oxide as a main component having an oxygen content higher than that of the first insulating layer 141 as in the second insulating layer 242 according to Modification 1, for example. The third insulating layer 443 may be laminated on the second insulating layer 142. The number of layers included in the gate insulating layer 440 is not limited to three layers. The gate insulating layer 440 may have a multi-layer structure composed of four or more layers.

Others

The thin film transistors according to the present disclosure have been described based on the embodiment and Modifications thereof, but the present disclosure will not be limited to the embodiment.

For example, in the embodiment, the aluminum oxide layer 160 is formed to reduce the resistance of the source region 132 and that of the drain region 133, but the method for reducing the resistance of the source region 132 and that of the drain region 133 is not limited to formation of the aluminum oxide layer. For example, another metal oxide layer which can draw oxygen from the oxide semiconductor layer 130 may be formed.

Specifically, as a main component, such a metal oxide layer replaced with the aluminum oxide layer 160 contains an oxide of a second metal having a bond dissociation energy higher than that of a first metal contained in the oxide semiconductor layer 130. Examples of the second metal include aluminum (Al), titanium (Ti), molybdenum (Mo), or tungsten (W).

The bond dissociation energy between the first metal and oxygen is shown below. Specifically, the bond dissociation energy between indium (In) and oxygen is 360 kJ/mol. The bond dissociation energy between zinc (Zn) and oxygen is 284 kJ/mol. The bond dissociation energy between gallium (Ga) and oxygen is 285 kJ/mol.

The bond dissociation energy between the second metal and oxygen is shown below. Specifically, the bond dissociation energy between aluminum (Al) and oxygen is 512 kJ/mol. The bond dissociation energy between titanium (Ti) and oxygen is 662 kJ/mol.

The bond dissociation energy between molybdenum (Mo) and oxygen is 607 kJ/mol. The bond dissociation energy between tungsten (W) and oxygen is 653 kJ/mol.

Accordingly, a molybdenum oxide layer, a titanium oxide layer, or a tungsten oxide layer may be formed as a metal oxide layer, for example.

Although an example in which the thin film transistor 100 is used as a driving circuit for the organic EL display device 10 has been described in the embodiment, the thin film transistor 100 may be used as a driving circuit for liquid crystal displays.

Besides, a variety of modifications of the embodiments conceived by those skilled in the art, and embodiments of any combination of the components and the functions in the embodiments without departing the gist of the present disclosure are also included within the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The thin film transistor according to the present disclosure can be widely used in display devices for television sets, personal computers, and mobile phones, solid-state imaging devices for digital cameras, or a variety of other electrical devices.

The invention claimed is:
1. A thin film transistor, comprising:
an oxide semiconductor layer including a channel region, and a source region and a drain region having a resistivity lower than a resistivity of the channel region;
a gate insulating layer disposed on the channel region of the oxide semiconductor layer;
a gate electrode disposed on the gate insulating layer, wherein a lateral surface of the channel region, the lateral surface of the gate insulating layer, and a lateral surface of the gate electrode are approximately flush with each other; and an aluminum oxide layer covering a lateral surface of the gate insulating layer, and the source region and the drain region, wherein the gate insulating layer has a multi-layer structure including a first insulating layer and a second insulating layer, and the first insulating layer contains silicon oxide as a main component, and is disposed on and in contact with the channel region.

2. The thin film transistor according to claim 1, wherein the second insulating layer has an oxygen content smaller than an oxygen content of the first insulating layer.

3. The thin film transistor according to claim 2, wherein the second insulating layer contains silicon nitride as a main component.

4. The thin film transistor according to claim 1, wherein the second insulating layer has a binding energy to oxygen higher than a binding energy to oxygen of the first insulating layer.

5. The thin film transistor according to claim 4, wherein the second insulating layer contains one of aluminum oxide, fluorine-added silicon oxide, carbon-added silicon oxide, and silicon oxynitride as a main component.

6. The thin film transistor according to claim 1, wherein the second insulating layer contains, as a main component, silicon oxide having an oxygen content higher than an oxygen content of the first insulating layer.

7. The thin film transistor according to claim 1, wherein the gate insulating layer further includes a third insulating layer disposed between the first insulating layer and the second insulating layer.

* * * * *